(12) United States Patent
Kishikawa

(10) Patent No.: US 9,941,451 B2
(45) Date of Patent: Apr. 10, 2018

(54) LIGHT EMITTING DEVICE AND METHOD OF MANUFACTURING LIGHT EMITTING MODULE

(71) Applicant: NICHIA CORPORATION, Anan-shi (JP)

(72) Inventor: Daisuke Kishikawa, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/336,800

(22) Filed: Oct. 28, 2016

(65) Prior Publication Data

US 2017/0125651 A1    May 4, 2017

(30) Foreign Application Priority Data

Oct. 30, 2015 (JP) .................................. 2015-213765

(51) Int. Cl.
| | |
|---|---|
| *H01L 33/00* | (2010.01) |
| *H01L 21/00* | (2006.01) |
| *H01L 33/56* | (2010.01) |
| *H01L 33/62* | (2010.01) |
| *H05K 1/18* | (2006.01) |
| *H05K 3/30* | (2006.01) |
| *H05K 13/04* | (2006.01) |
| *H01L 33/54* | (2010.01) |
| *H01L 33/64* | (2010.01) |

(52) U.S. Cl.
CPC .............. *H01L 33/56* (2013.01); *H01L 33/62* (2013.01); *H05K 1/181* (2013.01); *H05K 3/303* (2013.01); *H05K 13/0404* (2013.01); *H01L 33/54* (2013.01); *H01L 33/642* (2013.01); *H01L 2224/16225* (2013.01); *H01L 2933/0066* (2013.01); *H05K 2201/10106* (2013.01)

(58) Field of Classification Search
CPC ...... H01L 33/56; H01L 33/62; H05K 13/0404
USPC ............................................... 257/99; 438/27
See application file for complete search history.

(56) References Cited

U.S. PATENT DOCUMENTS

| | | | |
|---|---|---|---|
| 2010/0155764 A1 | 6/2010 | Serita et al. | |
| 2012/0049225 A1 | 3/2012 | Wakaki | |
| 2013/0181236 A1 | 7/2013 | Tamaki et al. | |

(Continued)

FOREIGN PATENT DOCUMENTS

| | | |
|---|---|---|
| CN | 103441203 | 12/2013 |
| EP | 1635403 | 3/2006 |

(Continued)

OTHER PUBLICATIONS

Extended European Search Report for corresponding EP Application No. 16196003.4-1551, dated Jan. 5, 2017.

*Primary Examiner* — David S Blum
(74) *Attorney, Agent, or Firm* — Mori & Ward, LLP

(57) ABSTRACT

A light emitting device includes a wiring board, a light emitting element, and a protection film. The wiring board includes a base member, and positive and negative wiring layer parts. The positive and negative wiring layer parts are arranged on or above the upper surface of the base member. The light emitting element is mounted on the wiring layer parts in a flip-chip manner. The protection film covers the base member, the wiring layer parts and the light emitting element, and is formed of an inorganic material for serving as the exterior surface of the light emitting device. Each of the wiring layer parts has a curved outer-side edge. The curvature of the outer-side edge is substantially constant.

10 Claims, 7 Drawing Sheets

(56) References Cited

U.S. PATENT DOCUMENTS

| | | |
|---|---|---|
| 2013/0299860 A1 | 11/2013 | Mineshita |
| 2014/0151737 A1 | 6/2014 | Wakaki |
| 2014/0174629 A1 | 6/2014 | Lai |
| 2015/0023026 A1 | 1/2015 | Sakamoto et al. |
| 2015/0194585 A1 | 7/2015 | Kim et al. |
| 2015/0280077 A1 | 10/2015 | Wakaki |

FOREIGN PATENT DOCUMENTS

| | | |
|---|---|---|
| JP | 04-107861 U | 1/1992 |
| JP | 10-308535 | 11/1998 |
| JP | 2000-294833 | 10/2000 |
| JP | 2007-243076 | 9/2007 |
| JP | 2008-072013 | 3/2008 |
| JP | 2008-078586 | 4/2008 |
| JP | 2008-300580 | 12/2008 |
| JP | 2009-105379 | 5/2009 |
| JP | 2009-130105 | 6/2009 |
| JP | 2009-532900 | 9/2009 |
| JP | 2010-056460 | 3/2010 |
| JP | 2010-129727 | 6/2010 |
| JP | 2011-204986 | 10/2011 |
| JP | 2012-069539 | 4/2012 |
| JP | 2013-110353 | 6/2013 |
| JP | 2013-143559 | 7/2013 |
| JP | 2013-254871 | 12/2013 |
| JP | 2013-254937 | 12/2013 |
| JP | 2015-500570 | 1/2015 |
| JP | 2015-023081 | 2/2015 |
| JP | 2015-062261 | 4/2015 |
| WO | WO 2007/126836 | 11/2007 |
| WO | WO 2009/031684 | 3/2009 |
| WO | WO 2013/085793 | 6/2013 |

LIGHT EMITTING DEVICE AND METHOD OF MANUFACTURING LIGHT EMITTING MODULE

CROSS-REFERENCE TO RELATED APPLICATIONS

The present application claims priority under 35 U.S.C. § 119 to Japanese Patent Application No. 2015-213,765, filed Oct. 30, 2015. The contents of this application are incorporated herein by reference in their entirety.

BACKGROUND

1. Field of the Invention

The present invention relates to a light emitting device and a method of manufacturing a light emitting module.

2. Description of the Related Art

Light emitting diodes (LEDs), which have advantages of low power consumption, long life, and high reliability and the like, are widely used as light emitting elements in light emitting devices such as various types of lighting devices and light sources for backlighting.

A light emitting device includes a light emitting element which can emit light with a wavelength in the ultraviolet range (hereinafter, occasionally referred to as ultraviolet light), a printed circuit board which has a recessed part for accommodating the light emitting element, and a transparent plate of glass or the like which closes the opening of the recessed part.

See Japanese Patent Laid-Open Publication No. JP 2008-78,586 A, for example.

SUMMARY

According to one aspect of the present disclosure, a light emitting device includes a wiring board, a light emitting element, and a protection film. The wiring board includes a base member, and positive and negative wiring layer parts. The positive and negative wiring layer parts are arranged on or above the upper surface of the base member. The light emitting element is mounted on the wiring layer parts in a flip-chip manner. The protection film covers the base member, the wiring layer parts, and the light emitting element. The protection film is formed of an inorganic material for serving as the exterior surface of the light emitting device. Each of the wiring layer parts has a curved outer-side edge. The curvature of the outer-side edge is substantially constant.

According to another aspect of the present invention, a method of manufacturing a light emitting device includes light-emitting-device preparation, mount-board preparation, nozzle preparation, and light-emitting-device positioning steps. In the light-emitting-device preparation step, a light emitting device is prepared. The light emitting device includes a wiring board, a light emitting element, and a protection film. The wiring board includes a base member, and wiring layer parts that are arranged in the central part of the base member. The light emitting element is bonded to the wiring layer parts. The protection film is formed of an inorganic material for covering the base member, the wiring layer parts and the light emitting element.

In the mount-board preparation step, a mount board is prepared which serves to hold the light emitting device. In the nozzle preparation step, a nozzle is prepared which has an opening size greater than the size of a combination of the wiring layer parts as viewed in plan view. In the light-emitting-device positioning step, the light emitting device is positioned on the mount board by picking up the light emitting device by suction by using the nozzle. When the light emitting device is picked up by the nozzle, the nozzle contacts the protection film on the base member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
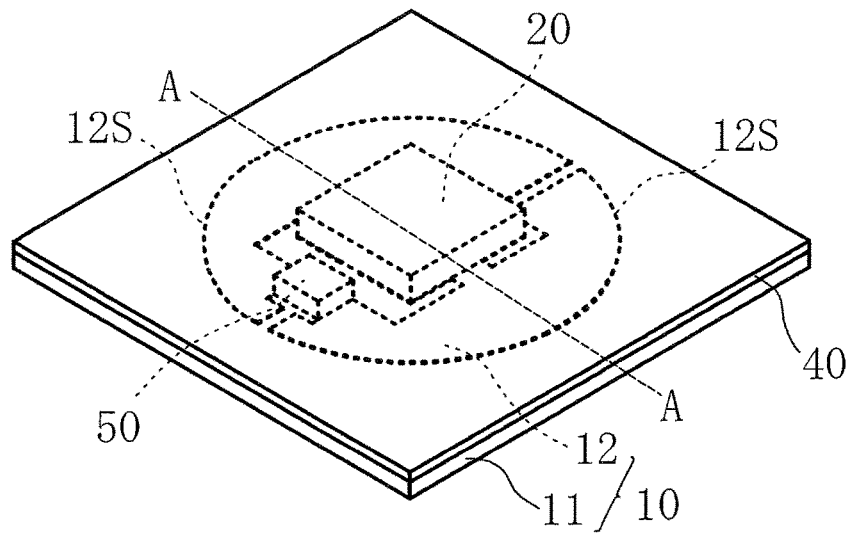
FIG. 1 is a schematic perspective view showing a light emitting device according to a first embodiment of the present invention.

The embodiments will now be described with reference to the accompanying drawings, wherein like reference numerals designate corresponding or identical elements throughout the various drawings.

It should be appreciated, however, that the embodiments described below are illustrations of a light emitting device and a method of manufacturing a light emitting module to give a concrete form to technical ideas of the invention, and a light emitting device and a method of manufacturing a light emitting module of the invention are not specifically limited to description below. Unless otherwise specified, any dimensions, materials, shapes and relative arrangements of the members described in the embodiments are given as an example and not as a limitation. Additionally, the sizes and the positional relationships of the members in each of drawings are occasionally shown exaggeratingly for ease of explanation. In addition, the members, and the like described in the embodiments and examples can be suitably combined with each other.

First Embodiment (Light Emitting Device)

Figure 2A:
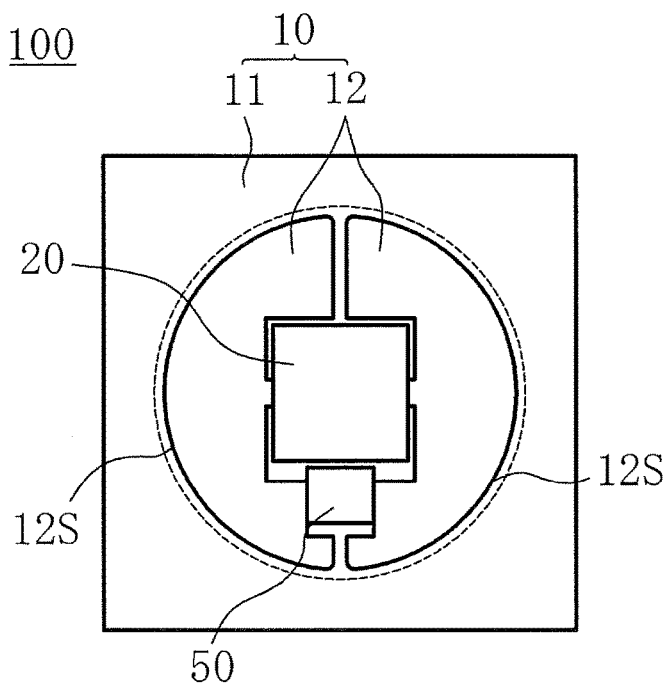
FIG. 2A is a schematic plan view showing the light emitting device according to the first embodiment of the present invention (a protection film is not illustrated for the sake of clarity in FIG. 2A)
Figure 2B:
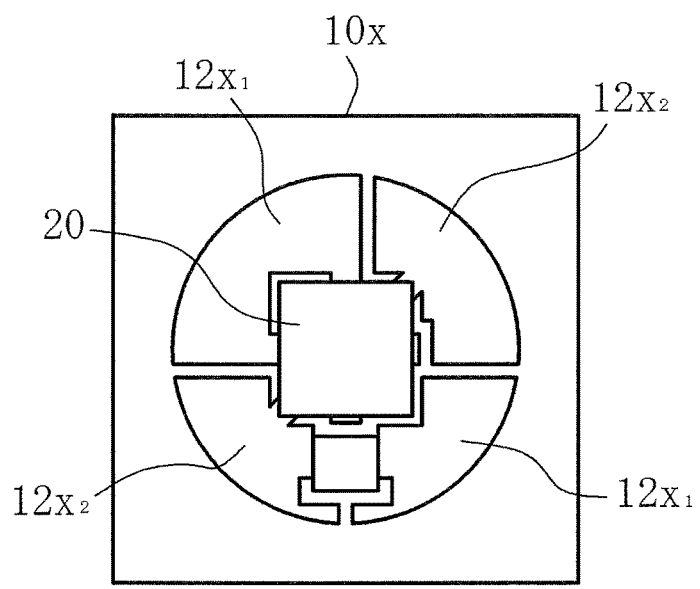
FIG. 2B is a schematic plan view showing a modified light emitting device which includes a wiring board having wiring layer parts with shapes different from FIG. 2A (the protection film is not illustrated for the sake of clarity in FIG. 2B)
Figure 2C:
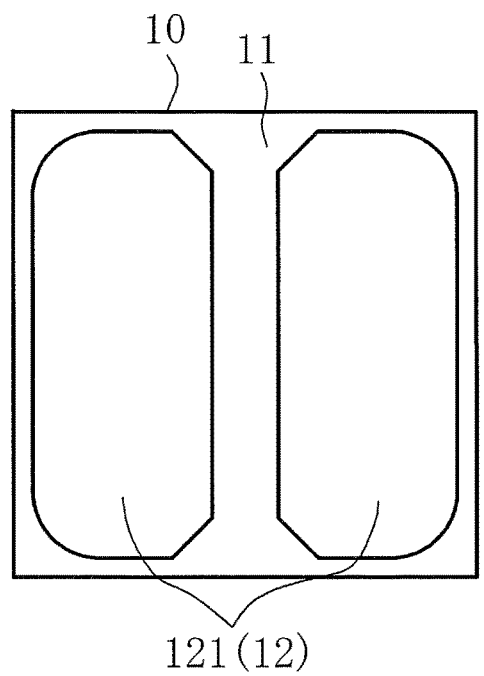
FIG. 2C is a schematic plan view showing the light emitting device according to the first embodiment of the present invention as viewed from the bottom side.
Figure 3:
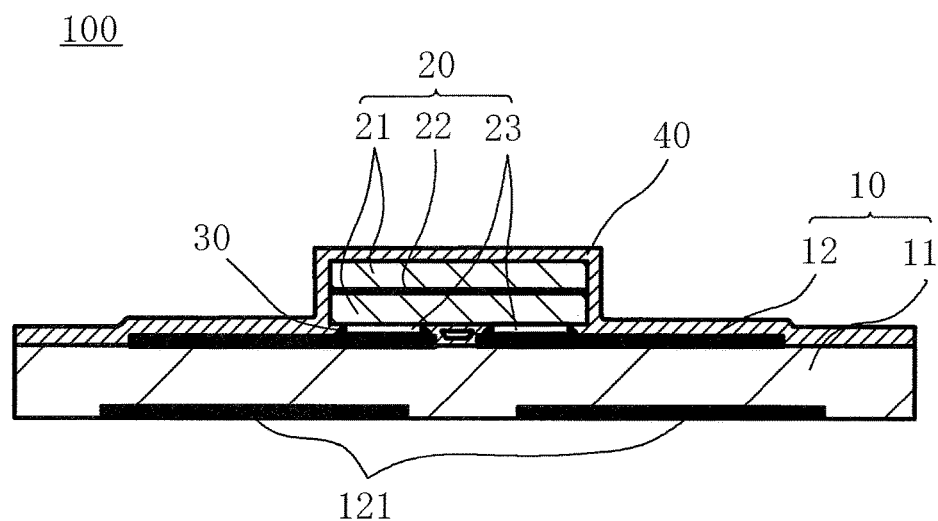
FIG. 3 is a schematic cross-sectional view of the light emitting device shown in FIG. 1 taken along the line A-A'.

FIG. 1 is a schematic perspective view showing a light emitting device 100 according to a first embodiment of the present invention. FIG. 2A is a schematic plan view showing the light emitting device 100 according to the first embodiment of the present invention. FIG. 2B is a schematic plan view showing a modified light emitting device which includes a wiring board having wiring layer parts with shapes different from FIG. 2A. It is noted that a protection film is not illustrated for the sake of clarity in FIGS. 2A and 2B. FIG. 2C is a schematic plan view showing the light emitting device according to the first embodiment of the present invention as viewed from the bottom side. FIG. 3 is a schematic cross-sectional view of the light emitting device 100 shown in FIG. 1 taken along the line A-A'. As shown in FIG. 1, in the light emitting device 100 according to the first embodiment, a light emitting element 20 is mounted on a wiring board 10 in a flip-chip manner.

The wiring board 10 has a flat plate shape, and includes a base member 11 and at least positive and negative wiring layer parts 12 which are arranged on or above the upper surface of the base member 11. Since the plate-shaped wiring board 10 is used, the light emitting device can be reduced in size as compared with a light emitting device which includes a wiring board having a recessed part.

As shown in FIG. 2A, each of the wiring layer parts 12 has a curved edge (hereinafter, referred to as "outer-side edge 12S of the wiring layer part") which faces outward of the wiring board 10 as viewed in plan view. The curvature of the curved edge is substantially constant. Although it is preferable that the outer-side edge 12S of the wiring layer is the aforementioned curve, at least 80%, preferably not smaller than 90% of the outer-side edge can be the aforementioned curve with a substantially constant curvature, and other part of the outer-side edge can have a curvature different from the aforementioned curve with a substantially constant curvature or can be straight.

In the first embodiment, the plane shape of a combination of the wiring layer parts 12 can be substantially circular, for example. The "plane shape of a combination of the wiring layer parts 12" refers not to the plane shape of one of the positive and negative wiring layer parts 12, which are spaced away from each other, but to the plane shape of one area which is considered as a combination of the positive and negative wiring layer parts 12 as shown by the dotted line in FIG. 2A, in other words, the shape which is obtained by connecting the outer-side edges 12S of the wiring layer parts to each other as viewed in plan view.

In the first embodiment, as shown in FIG. 2A, the wiring layer parts 12, which have the aforementioned plane shape, are arranged in the central part of the upper surface of the wiring board 10, which has a rectangular shape as viewed in plan view. Consequently, the upper surface of the wiring board 10 is occupied by the positive and negative wiring layer parts 12 in the central part, and areas of the base member 11 which are exposed between the positive and negative wiring layer parts 12, and outside the wiring layer parts 12.

More specifically, in the first embodiment, as shown in FIGS. 1 and 2A, two wiring layer parts 12, which are positive and negative wiring layer parts, are arranged on the base member 11. The edge of each of the positive and negative wiring layer parts 12, which faces outward of the wiring board 10, is a curved line the curvature of which is substantially constant. Accordingly, the plane shape of the combination of the wiring layer parts 12 is substantially circular. In the case where the wiring board 10 includes the pair of wiring layer parts (the aforementioned positive and negative wiring layer parts) 12, the shape of the wiring layer part 12 is not complicated. As a result, the pattern of the wiring layer parts can be easily formed. In addition, since the area of one wiring layer part of this wiring board can be large, the heat dissipation performance of one wiring layer part can improved. Therefore, a light emitting device having good heat dissipation performance can be provided. It is noted that the shape and the number of wiring layer parts are not limited to the aforementioned wiring layer parts. The wiring board can include a suitable number of wiring layer parts which have suitable shapes depending on the electrode pattern of the light emitting element mounted on the wiring board. For example, as shown in FIG. 2B, a wiring board 10$x$ can be used which includes two or more pairs of wiring layer parts each pair of which consists of a positive wiring layer part 12$x_1$ and a negative wiring layer part 12$x_2$.

In addition, the base member 11 may be exposed from the upper surface of the wiring board 20 in an area other than the area of the gap between the positive and negative wiring layer parts 12, and the area outside the wiring layer parts 12. For example, as shown in FIGS. 1 and 2A, the areas of the base member 11 can be exposed which are located on at least parts of the outer-side edges of the light emitting element 20 mounted on the wiring board, for example, on the parts along the corners the outer-side edges of the light emitting element 20. In this case, the mounting position of the light emitting element 20 can be easily found. As a result, the light emitting element 20 can be easily mounted at the desired position. Additionally, this can suppress the spread of a bonding material for bonding the light emitting element 20. Also, in order to determine whether the positive or negative wiring layer part 12, an anode mark, cathode mark, or the like may be indicated in an exposed part of the base member which is arranged in the area inside the wiring layer parts as viewed in plan view.

In the first embodiment, as shown in FIG. 2C, the wiring layer parts are arranged as back surface wiring layer parts 121 on the bottom surface of the wiring board opposite to the upper surface on which the light emitting element is mounted. The back surface wiring layer parts 121 serve to electrically connect the light emitting device 100 to a mount board or the like when the light emitting device 100 is mounted to the mount board. The back surface wiring layer parts 121 can be arranged in suitable areas depending on the circuit pattern or the like of the mount board.

The light emitting element 20 includes semiconductor layers 21 including a light emitting layer 22, and positive and negative electrodes 23 which are arranged on one surface side, as shown in FIG. 3. The light emitting element 20 according to the first embodiment is connected by an electrically conductive bonding material 30 to the positive and negative wiring layer parts 12 in a flip-chip manner. In this case, the light emitting device can be easily reduced in size as compared with the case where wires or the like are used.

As shown in FIG. 2A, in the first embodiment, the light emitting element 20 has a rectangular shape as viewed in plan view. The outer-side edges 12S of the wiring layer parts are located outside the light emitting element 20. According to this arrangement, heat can be efficiently dissipated from the light emitting element 20 outward of the light emitting device. In the first embodiment, the light emitting element 20 is arranged in the central part of the combination of the positive and negative wiring layer parts 12. That is, the light emitting element 20 is arranged at the position which is spaced at a substantially constant distance to the outer-side edges 12S of the wiring layer parts from the center of the light emitting element 20. It is noted that the "substantially constant distance to the outer-side edges 12S of the wiring layer parts from the center of the light emitting element 20" refers to a constant distance which contains a deviation falling within the range from 0.05 to 0.25 mm.

As discussed above, in the case where the plane shape of the combination of the wiring layer parts 12 is substantially circular, the distance from the center of the light emitting element 20 to the outer-side edges 12S of the wiring layer parts can be substantially constant. As a result, heat from the light emitting element 20 can be uniformly dissipated in the outward directions of the wiring board 10. Therefore, heat can be uniformly dissipated from the light emitting element 20, for example, as compared with a wiring board which has wiring layer parts with a rectangular plane shape. As a result, heat is likely to be smoothly dissipated from the light emitting device. In addition, heat is unlikely to be held in the area in proximity to the light emitting element 20. Consequently, deterioration of the light emitting element 20 can be suppressed.

A protection film 40 is formed of an inorganic material, and covers the base member 11, the wiring layer parts 12, and the light emitting element 20. As shown in FIGS. 1 and 3, the protection film 40 seals the light emitting element 20, and serves as the exterior surface of the light emitting device 100. It is preferable that the light emitting element 20 is sealed only by the protection film 40 in terms of size reduction of the light emitting device 100. As shown in FIG. 3, the protection film 40 according to the first embodiment continuously covers the upper surface of the wiring board 10 and the light emitting element 20, in other words, the protection film 40 does not have gaps such as apertures or slits. The area covered by the protection film 40 includes the boundaries between the light emitting element 20 and both the base member 11 and the wiring layer parts 12. According to this construction, the light emitting element 20 and the wiring board 10 can be protected from dust, dirt and moisture from the outside. As a result, deterioration of the light emitting element 20 and the wiring board 10, in particular, oxidation of the light emitting element 20 can be prevented. Consequently, the reliability of the light emitting device 100 can be improved. Although the protection film 40 according to the first embodiment covers the entire upper surface of the wiring boards 10, which contains the area where the light emitting element 20 is not arranged, as shown in FIG. 3, the protection film may cover the area inside the outer edges of the upper surface of the wiring board, for example. In other words, the areas in proximity to the outer edges of the upper surface of the wiring board 10 may be exposed from the protection film 40. Although it is preferable that the protection film covers the base member 11, the wiring layer parts 12, and the light emitting element 20 without gaps, small gaps are acceptable in the case where the protection film is formed by sputtering or the like, for example. Also, the protection film 40 according to the first embodiment may cover the side surfaces and bottom surface of the wiring board 10 in addition to the upper surface of the wiring board 10. In the case where the protection film 40 covers the bottom surface of the wiring board 10, the back surface wiring layer parts 121 are exposed from the protection film 40.

It is preferable that the thickness of the protection film 40 falls within the range approximately from 1 nm to 10 μm, more preferably from 30 to 200 nm. This protection film which has a relatively small thickness can facilitate size reduction of the light emitting device.

Additionally, the light emitting device 100 can include an electronic component 50 relating to the current or driving control of the light emitting element 20, as shown in FIG. 1. In particular, in the case where the light emitting device includes a protection component (e.g., Zener diode) as the electronic component 50, the light emitting device can be provided which is reliable in terms of current or driving control. The electronic component 50 can be mounted on the wiring board in a flip-chip manner or be electrically connected to the wiring board by wires, or the like. In the case where the electronic component 50 is provided, the protection film 40 preferably covers the base member 11, the wiring layer parts 12, the light emitting element 20, and the electronic component 50 without gaps.

As discussed above, since the light emitting element is mounted on the plate-shaped wiring board in a flip-chip manner, and the wiring board and the light emitting element are sealed by the protection film formed of an inorganic material, the light emitting device according to the present invention can be small and has a simple structure. In addition, since the outer-side edges of the wiring layer parts of the wiring board are curved line with a constant curvature, and the light emitting element is arranged at the position which is spaced at a substantially constant distance to the outer-side edges of the wiring layer parts from the center of the light emitting element, heat from the light emitting element can be uniformly dissipated to the wiring board. As a result, this uniform heat dissipation allows efficient dissipation of heat from the light emitting element to the outside, which can suppress thermal deterioration of the members. Therefore, the light emitting device according to the present invention can be reliable, but small and simple in structure.

The following description will describe members of the light emitting device 100 of according to the first embodiment.

(Wiring Board)

The wiring board 10 is preferably formed of a material which can prevent transmission of light emitted from the light emitting element 20, which is mounted on the upper surface of the wiring board 10.

Exemplary materials of the base member 11 can be provided by insulators such as ceramic, resin, and glass. In particular, ceramic, which is an inorganic material, is preferably used from the viewpoint of heat dissipation. In the case where the base member 21 is formed of an inorganic material, the adhesive strength between the protection film, which is formed of an inorganic material, and the base member. Particularly, it is preferable that aluminum nitride, which has high heat dissipation characteristics, is used as the ceramic.

The material of the wiring layer parts 12 is not specifically limited as long as the wiring layer parts 12 can be electrically connected to the light emitting element 20. The wiring layer parts 12 can be any material known in the art. Exemplary materials of the wiring layer parts can be provided by metals such as copper, aluminum, gold, and silver. The wiring layer parts 12 can be formed by metal plating, sputtering and other known methods. A lead frame can be used as the wiring layer parts 12.

Any of suitable plane shapes can be suitably selected such as roughly rectangular shape, circular shape, polygonal shape (e.g., triangle or hexagon) for the wiring board 10.

(Light Emitting Element)

The light emitting element 20 can be a light emitting diode, a laser diode, or the like, which are typically used in the art. The light emitting element 20 includes a semiconductor layer 21. For example, various types of III-V compound semiconductors such as nitride-based semiconductor ($In_xAl_yGa_{1-x-y}N$, $0 \leq x$, $0 \leq y$, $x+y \leq 1$), Gap, GaAs, and the like can be used for the semiconductor layer 21. The light emitting element 20 includes a pair of electrodes 23. Exemplary materials of electrodes 23 can be provided by metals such as Au, Ag, Cu, Pt, Al, Rh, W, Ti, Ni, and Pd. The electrode 23 can be constructed of a single layer formed of any of these metals, or be a multilayer film formed of two or more metals selected from these metals.

In addition to the aforementioned semiconductor layer 21 and the pair of electrodes 23, the light emitting element 20 may include a substrate for facilitating the growth of the semiconductor layer 21. Exemplary materials of the substrate can be provided by an insulating substrate (e.g., sapphire), SiC, ZnO, Si, GaAs, diamond, and oxide substrates such as lithium niobate and neodymium gallate which are bondable with a nitride semiconductor in a lattice-matching manner. The substrate preferably has transparency. Alternatively, the substrate may be removed by laser lift off, or the like.

The light wavelength of the light emitting element 20 is not specifically limited. Any light emitting element with a desired light wavelength can be suitably selected. In the case where a light emitting element is used which emits high energy light such as ultraviolet light (e.g., light wavelength from 200 to 410 nm), such a light emitting element will generate a larger amount of heat as compared with a light emitting element which emits visible light. In this case, the heat is required to be more efficiently dissipated. For this reason, it is preferable that the distance from the center of the light emitting element 20 to the outer-side edges 12S of the wiring layer parts is constant as discussed above in the first embodiment in order to uniformly dissipate heat to the wiring board 10 so that the heat dissipation performance of the light emitting device can be improved. This arrangement can suppress thermal deterioration of the members.

The plane shape of the light emitting element 20 is not specifically limited to a rectangular shape, but can be a polygonal shape such as hexagon. In particular, in the case where such a hexagonal light emitting element is arranged on the wiring layer parts the combination of which has a substantially circular plane shape, the parts of the outer-side edges of this hexagonal light emitting element which are positioned at the same distance to the outer-side edges of the wiring layer parts can be longer as compared with the case where the rectangular light emitting element is arranged on the wiring layer parts the combination of which has a substantially circular plane shape, which provides a constant distance only from the center of the light emitting element to the outer-side edges of the wiring layer parts. Consequently, heat from the light emitting element can be more uniformly dissipated in outward directions. The dimension of the light emitting element 20 is not specifically limited as long as the light emitting element is smaller than the combination of the wiring layer parts 12 as viewed in plan view.

(Protection Film)

Exemplary materials of the protection film 40 can be provided by inorganic materials such as aluminum oxide ($Al_2O_3$), silicon dioxide ($SiO_2$), aluminum nitride (AlN), and silicon nitride ($Si_3N_4$). In particular, aluminum oxide is preferably used. In this case, light from the light emitting element 20 is unlikely to be absorbed by the protection film 40, and the protection film 40 can be easily formed to be dense and to be able to protect the light emitting element 20 from moisture, and the like.

The protection film 40 can be formed by atomic layer deposition (hereinafter, occasionally referred to as "ALD"), sputtering, CVD, or the like after the light emitting element is mounted on the wiring board. In particular, in the case of ALD, the protection film can be formed without gaps, and have a uniform thickness. As a result, moisture, or the like is unlikely to enter the light emitting device from the outside, and the light emitting element 20 is unlikely to be oxidized. Therefore, the light emitting device can be reliable.

The protection film can consist of a single layer film, or be a multilayer film formed of two or more different types of materials. In the case where the protection film is constructed of a multilayer film, the light extracting efficiency from the light emitting element can be improved. For example, $Al_2O_3$ and $SiO_2$ with suitable thicknesses can be alternately deposited on each other.

(Light Emitting Module)

Figure 4:
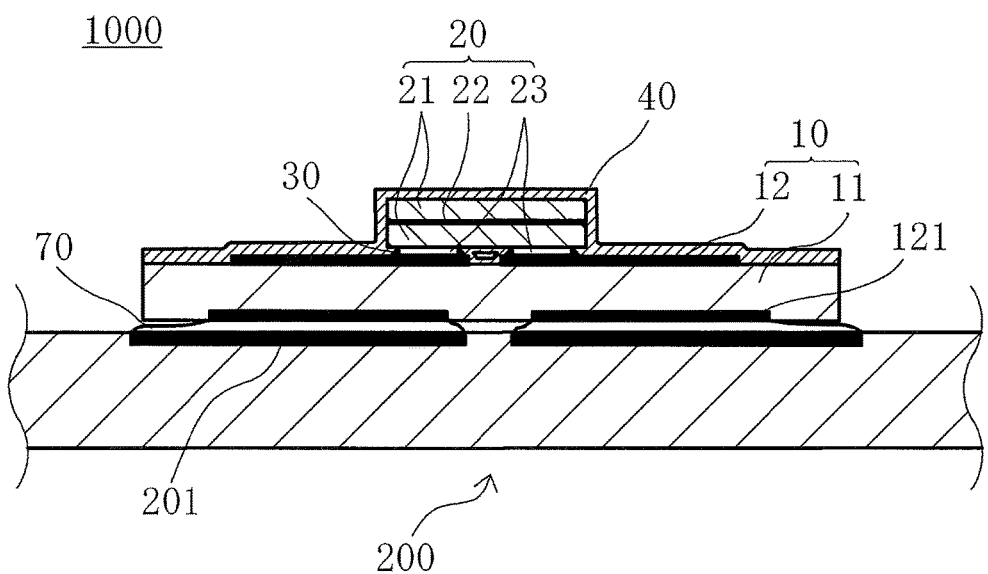
FIG. 4 is a schematic cross-sectional view showing a light emitting module according to the first embodiment of the present invention.

FIG. 4 is a schematic cross-sectional view showing a light emitting module 1000 according to the first embodiment of the present invention. The light emitting module 1000 according to the first embodiment includes the aforementioned light emitting device 100, and a mount board 200. The aforementioned light emitting device 100 is mounted on the mount board 200. The light emitting module 1000 can be used as a light source for printing or curing, and a light source of sensors, for example.

At least positive and negative wiring portions 201 are arranged on the surface of the mount board 200. The positive and negative wiring portions 201 are electrically connected to the positive and negative wiring layer parts 12 of the light emitting device 100, respectively. In the first embodiment, the positive and negative back surface wiring layer parts 121 on the back surface of the light emitting device 100 (i.e., the surface of the wiring board 10 opposite to the side where the light emitting element 20 is mounted) are connected to the positive and negative wiring portions 201 of the mount board 200 by an electrically conductive bonding material, respectively. The electrical connection is not limited to this. The wiring layer parts of the light emitting device may be electrically be connected to the wiring portions of the mount board by wires, and the like.

The following description will describe a method of manufacturing the light emitting module 1000.

(Production Method of Light Emitting Module)

Figure 5A:
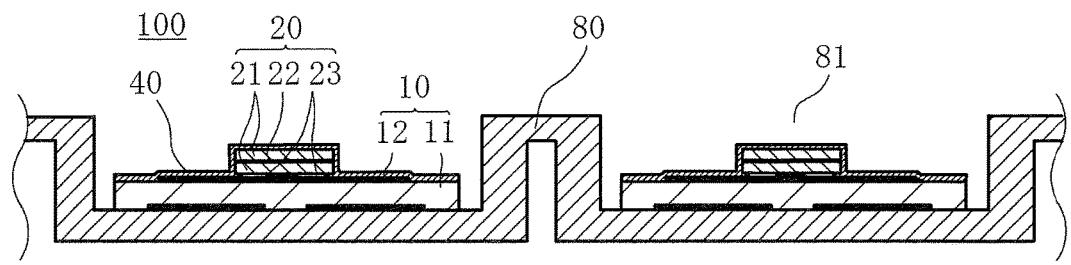
FIG. 5A is a schematic cross-sectional view showing a light-emitting-device preparation step in a method of manufacturing the light emitting module according to the first embodiment of the present invention.
Figure 5B:
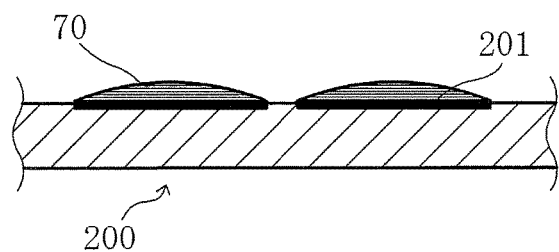
FIG. 5B is a schematic cross-sectional view showing a mount-board preparation step in the method of manufacturing the light emitting module according to the first embodiment of the present invention.
Figure 5C:
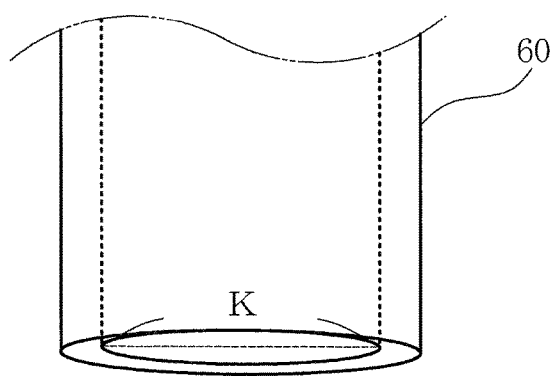
FIG. 5C is a schematic side view showing a nozzle preparation step in the method of manufacturing the light emitting module according to the first embodiment of the present invention.
Figure 5D:
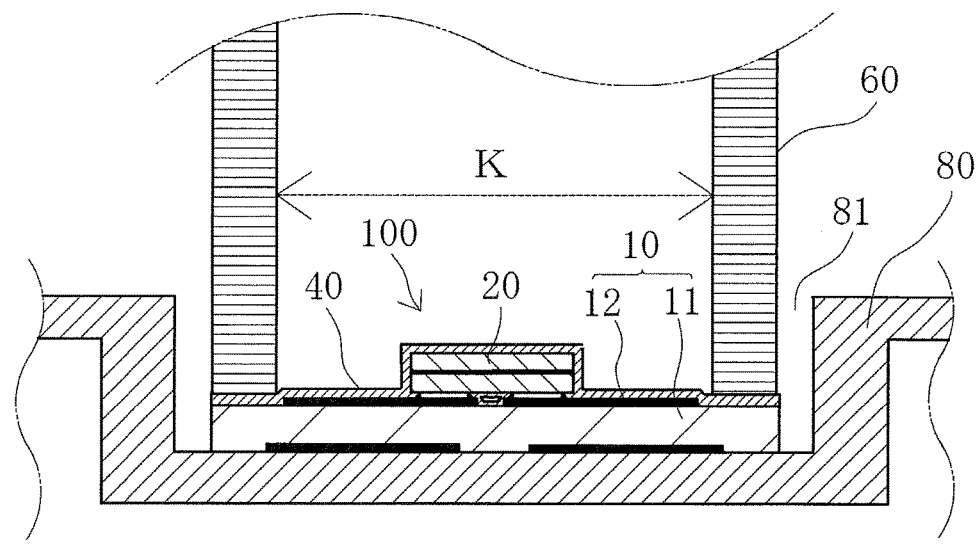
FIG. 5D is a schematic cross-sectional view showing a light-emitting-device positioning step in the method of manufacturing the light emitting module according to the first embodiment of the present invention.
Figure 5E:
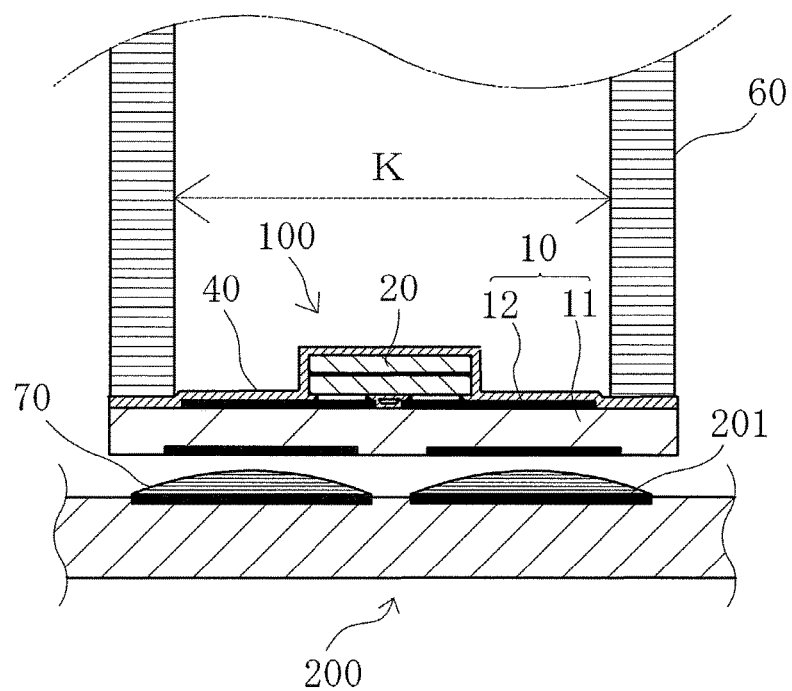
FIG. 5E is a schematic cross-sectional view showing the light-emitting-device positioning step in the method of manufacturing the light emitting module according to the first embodiment of the present invention.
Figure 6A:
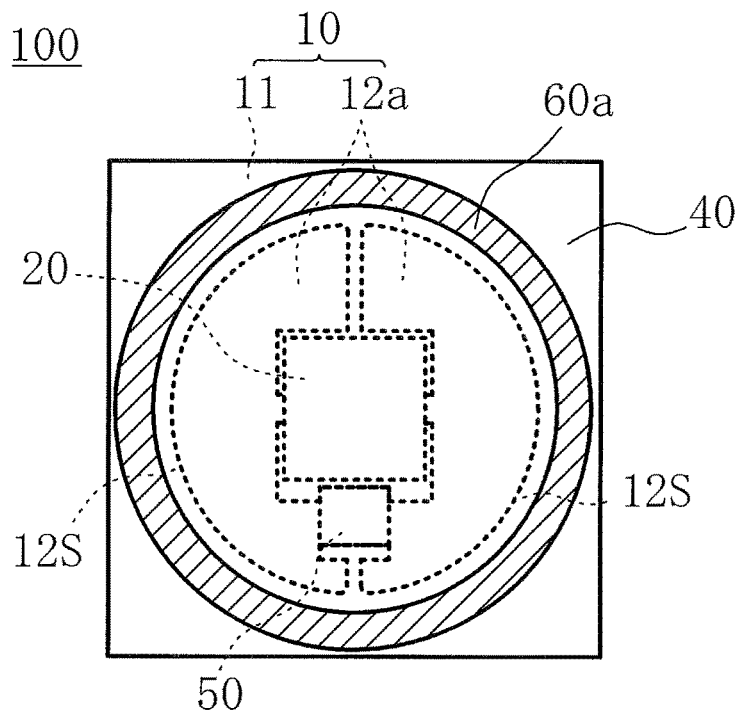
FIG. 6A is a schematic plan view showing the plan shape of a combination of the wiring layer parts of the wiring board of the light emitting device, and a closed contact line of the nozzle in contact with the wiring board in the method of manufacturing the light emitting module according to the first embodiment of the present invention.
Figure 6B:
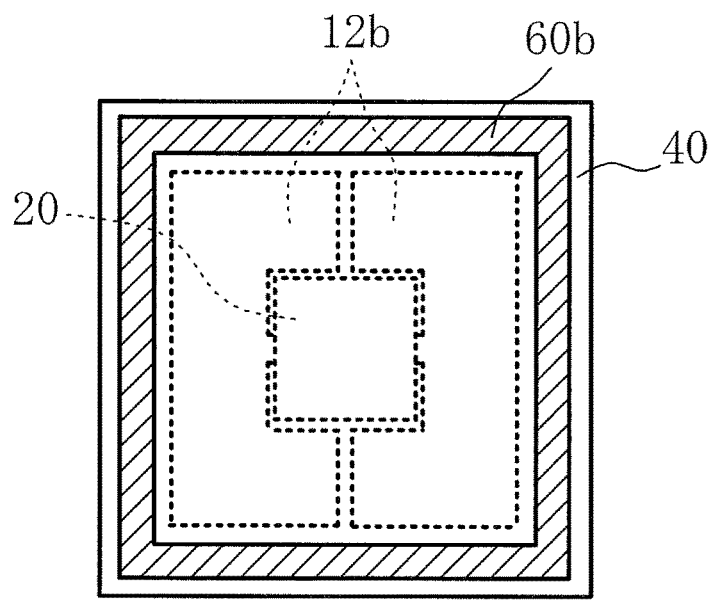
FIG. 6B is a schematic plan view showing the plan shape of a combination of wiring layer parts of a wiring board of a modified light emitting device, and a closed contact line of a nozzle in contact with the wiring board in the method of manufacturing the light emitting module according to the first embodiment of the present invention.
Figure 6C:
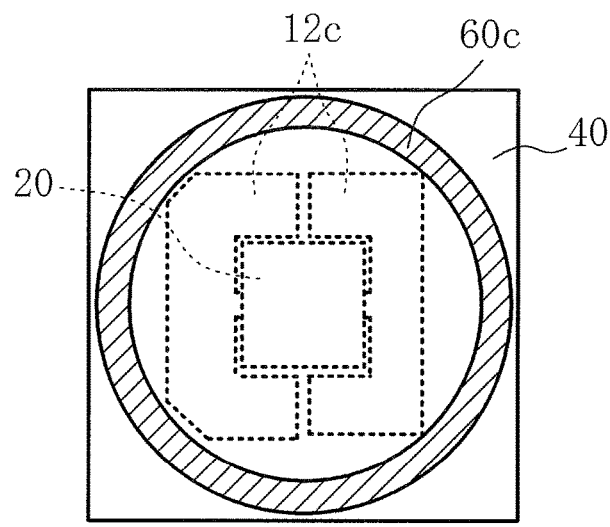
FIG. 6C is a schematic plan view showing the plan shape of a combination of wiring layer parts of a wiring board of a modified light emitting device, and a closed contact line of the nozzle in contact with the wiring board in the method of manufacturing the light emitting module according to the first embodiment of the present invention.

FIG. 5A is a schematic cross-sectional view showing a light-emitting-device preparation step in a method of manufacturing the light emitting module according to the first embodiment of the present invention. FIG. 5B is a schematic cross-sectional view showing a mount-board preparation step in the method of manufacturing the light emitting module according to the first embodiment of the present invention. FIG. 5C is a schematic side view showing a nozzle preparation step in the method of manufacturing the light emitting module according to the first embodiment of the present invention. FIGS. 5D and 5E are schematic cross-sectional views showing a light-emitting-device positioning step in the method of manufacturing the light emitting module according to the first embodiment of the present invention. FIGS. 6A to 6C are schematic plan views showing the plan shapes of combinations of the wiring layer parts of the wiring boards of light emitting devices, and closed contact lines of nozzles in contact with the wiring boards in the method of manufacturing light emitting modules according to the first embodiment of the present invention.

In the method of manufacturing a light emitting module 1000 according to the first embodiment, a light emitting device is first prepared. The light emitting device includes a wiring board, a light emitting element, and a protection film. The wiring board includes a base member, and wiring layer parts that are arranged in the central part of the base member. The light emitting element is connected to the wiring layer parts. The protection film is formed of an inorganic material for covering the base member, the wiring layer parts and the light emitting element. Also, a mount board that serves to hold the light emitting device is prepared. Also, a nozzle that has an opening diameter (opening size) greater than a combination of the wiring layer parts as viewed in plan view is prepared. The nozzle is a suction nozzle which is used to pick up electronic components by suction in surface-mounting machines (mounters) used for mounting electronic components, and the like, for example. Subsequently, the light emitting device is picked up by the nozzle, and positioned on the mount board. When the light emitting device is picked up, the nozzle is brought into contact with the protection film on the base member.

As stated above, when the light emitting device is picked up by the nozzle, since the nozzle is not in contact with the protection film on the light emitting element and the wiring layer parts, it is possible to prevent cracking of the protection film on the light emitting element and the wiring layer parts due to the impact during the contact event. As a result, oxidation of the light emitting element can be prevented by preventing cracking of the protection film on the light emitting element. Also, deterioration of the wiring layer parts can be prevented by preventing cracking of the protection film on the wiring layer. Consequently, absorption or the like of light from the light emitting element by deteriorated wiring layer parts can be prevented.

The following description will describe steps of the method of manufacturing the light emitting module 1000 according to the first embodiment.

(Light-Emitting-Device Preparation Step)

In the light-emitting-device preparation step, the light emitting devices 100 to be positioned on the mount board are prepared. In this preparation step, the prepared light emitting devices 100 are arranged in recessed parts 81 of an embossed carrier tape 80, as shown in FIG. 5A, so that the light emitting devices 100 are ready to be picked up by the nozzle in the following light-emitting-device positioning step. Since the light emitting devices 100 are spaced at a fixed interval away from each other, the light emitting device 100 can be easily picked up by sucking the light emitting device in the following light-emitting-device positioning step.

Specifically, the prepared light emitting device 100 includes the plate-shaped wiring board 10, which includes the base member 11 and the wiring layer parts 12 arranged in the central part of the base member 11, and the light emitting element 20, which is mounted on the wiring board 10. The "wiring layer parts 12 arranged in the central part of the base member 11" is referred to wiring layer parts 12 surrounded by the base member 11 as viewed in plan view. The combination of the wiring layer parts 12 of the wiring board 10 is smaller than the opening diameter of the nozzle as viewed in plan view as discussed later.

In the light-emitting-device preparation step, it is preferable that the plane shape of the combination of the wiring layer parts 12 of the wiring board 10 of the prepared light emitting device 100 and the opening shape of the nozzle, which will be prepared in the nozzle preparation step, are similar figures, and that the plane shape of the combination of the wiring layer parts 12 has a size equal to or smaller than the opening shape of the nozzle. For example, in the case where a typical nozzle with a circular opening shape is prepared, as shown in FIG. 6A, a light emitting device 100a can be prepared which includes a circular plane shape of a combination of wiring layer parts 12a, which is arranged inside a contact circle (circular line) 60a of the nozzle. In other words, the circular plane shape of the combination of the wiring layer parts 12a is smaller than the opening diameter of the nozzle. Alternatively, in the case where a nozzle with a rectangular opening shape is prepared, as shown in FIG. 6B, a light emitting device 100b can be prepared which includes a rectangular plane shape of a combination of wiring layer parts 12b, which is arranged inside a contact rectangle (rectangular line) 60b of the nozzle. In other words, the length and the width of the rectangular plane shape of the combination of the wiring layer parts 12b are smaller than the length and the width of the opening (opening size) of the nozzle. Accordingly, the wiring layer parts of the prepared light emitting device can widely extend in the area inside the contact circle or rectangle (contact line) where the nozzle is not contact with the protection film on the wiring layer parts 12 in the subsequent light-emitting-device positioning step. Therefore, a light emitting module can be easily provided which has good heat dissipation performance in addition to reliability which is provided by preventing cracking of the protection film on the wiring layer parts.

It is noted that a light emitting device may be prepared which includes a different plane shape of a combination of wiring layer parts, which is different from the opening shape of the nozzle, as long as the different plane shape of a combination of wiring layer parts is smaller than the size of the opening of the nozzle as viewed in plan view. For example, in the case where a nozzle with a circular opening shape is prepared, as shown in FIG. 6C, a light emitting device 100c can be prepared which includes a rectangular plane shape of a combination of wiring layer parts 12c, which is arranged inside a contact circle 60c of the nozzle. In other words, the size of the rectangular plane shape of the combination of the wiring layer parts 12c is smaller than the opening diameter of the nozzle. In addition, as shown in FIG. 6C, some of the corners of the rectangular plane shape of the combination of the wiring layer parts 12c can be rounded so that the rounded corners do not overlap the contact circular line of the nozzle.

Although the outer-side edge of the contact line of the nozzle shown in FIGS. 6A to 6C (i.e., the outer-side edge of the nozzle) is brought into contact with the area inside the outer-side edges of the wiring board of the light emitting device, the outer-side edges of the contact line of the nozzle may be brought into contact with the area outside the outer-side edges of the wiring board. Also, although the opening shape of the nozzle and the outer-side edge of the nozzle are shown as similar figures in FIGS. 6A to 6C, the plane shape of the outer-side edge of the nozzle is not specifically limited.

The light emitting device 100 to be prepared in the first embodiment includes the positive and negative back surface wiring layer parts 121 on the back surface of the wiring board 10 (i.e., the surface of the wiring board 10 opposite to the side where the light emitting element 20 is mounted) to be electrically connected to the mount board.

In the first embodiment, the light emitting device 100 is prepared which includes the light emitting element 20 mounted on the wiring layer parts 12 of the wiring board 10 in a flip-chip manner. The light emitting element 20 includes the semiconductor layers 21, which has the light emitting layer 22, and the positive and negative electrodes 23, which are arranged on one surface side of the light emitting element 20. According to this construction, disconnection of the light emitting element 20 due to contact with the nozzle is unlikely to occur in the subsequent light-emitting-device positioning step as compared with the case where the light emitting element 20 is connected to the wiring board 10 by wires. Therefore, the light emitting module 1000 can be produced at high yield.

In addition, the prepared light emitting device 100 includes the protection film 40 which covers the base member 11 and the wiring layer parts 12 of the wiring board 10, and the light emitting element 20 bonded to the wiring layer parts 12. The protection film 40 is formed of an inorganic material for serving as the exterior surface of the light emitting device 100.

(Mount-Board Preparation Step)

In the mount-board preparation step, the mount board 200 is prepared which serves to hold the light emitting device 100. As shown in FIG. 5B, the positive and negative wiring portions 201 are arranged on the surface of the mount board 200, and serve for electrical connection to the light emitting device 100, which is mounted on the mount board 200. The structure of the wiring portion 201 is not specifically limited as long as the wiring portion can be connected to the light emitting element 100. In the first embodiment, the mount board 200 is arranged at the position where the positive and negative wiring portions 201 will face the positive and negative back surface wiring layer parts 121 of the light emitting device 100 to be mounted onto the upper surface of the mount board 200.

At this time, a bonding material 70 for bonding the light emitting device 100 can be provided at the positions of the upper surface of the mount board 200 where the light emitting device 100 will be bonded. Any typical electrically conductive or insulating bonding material can be suitably selected. Exemplary electrically conductive bonding materials can be provided by metal paste containing at least one selected from the group consisting of Au, Ag, Bi, Cu, In, Pb, Sn and Zn, eutectic material, carbon paste, and wax material. Exemplary electrically insulating bonding materials can be provided by resins such as epoxy resin, silicone resin and acrylate resin, and glass. Alternatively, an anisotropic conductive material, or the like may be used. In the first embodiment, the electrically conductive bonding material 70 is provided on the positive and negative wiring portions 201 of the mount board 200. The bonding material 70 can be arranged by a suitable known method such as applying, printing or spraying method.

(Nozzle Preparation Step)

In the nozzle preparation step, in order to position the light emitting device 100 on the mount board 200 in the subsequent light-emitting-device positioning step, the nozzle 60 is prepared which picks up the light emitting device 100 by sucking the light emitting device 100. Any of known nozzles which are typically used to mount electronic components in surface-mounting machines (mounters) can be suitably selected as the nozzle 60. In the nozzle preparation step, as shown to FIG. 5C, the opening diameter K of the prepared nozzle 60 is smaller than the wiring board 10 of the light emitting device 100 as viewed in plan view, and is larger than the combination of the wiring layer parts 12 of the wiring board 10 as viewed in plan view. Accordingly, the nozzle 60 can be brought into contact with the protection film 40 on the base member 11 of the wiring board 10 when the light emitting device 100 is picked up in the light-emitting-device positioning step. Since the nozzle 60 does not contact the protection film 40 on the wiring layer parts 12 when the light emitting device 100 is picked by the nozzle 60, this arrangement can reduce the possibility that the protection film 40 on the wiring layer parts 12 is cracked by the impact by the nozzle during the contact event.

In the first embodiment, it is preferable that the opening diameter K of the prepared nozzle 60 is 0.05 to 0.25 mm larger than the size of the combination of the wiring layer parts 12, for example. In this case, it is possible to further reduce the possibility that the protection film 40 on the wiring layer parts 12 is cracked. It is noted that the opening shape of the nozzle is not specifically limited as long as the opening diameter K is larger than the size of the combination of the wiring layer parts 12 of the wiring board 10. Any of opening shapes can be suitably selected for the nozzle such as polygonal shape (e.g., triangle, rectangle, hexagon, and the like), or the like as well as circular shape, which is used for typical nozzles.

The order of the light-emitting-device preparation step, the mount-board preparation step, and the nozzle preparation step is not specifically limited. These steps can be performed in any suitable order.

(Light-Emitting-Device Positioning Step)

After the light-emitting-device preparation step, the mount-board preparation step and the nozzle preparation step, the light emitting device 100 is picked up by suction by the prepared nozzle 60 and is positioned on the mount board 200 in the light-emitting-device positioning step. In the light-emitting-device positioning step, as shown in FIG. 5D, the nozzle 60 is positioned so as to contact neither the protection film 40 on the light emitting element 20 of the light emitting device 100 nor the protection film 40 on the wiring layer parts 12, and the light emitting device 100 is picked up by suction by using the nozzle 60. In other words, the nozzle 60 is positioned so as to contact the area of the protection film 40 on the base member 11 outside the wiring layer parts 12, and the light emitting device 100 is then picked up by the nozzle 60. For example, the nozzle 60 is brought into contact with the protection film 40 on the base member 11 along a closed line which is spaced 0.05 to 0.25 mm away from the outline of the combination of the wiring layer parts 12, when the light emitting device 100 is picked up by suction. In the case where the nozzle 60 is brought into contact with the area of the protection film 40 on the base member 11 outside the wiring layer parts 12, and picks up the light emitting device 100, since the nozzle 60 does not contact the protection film 40 on the wiring layer parts 12, cracking of the protection film 40 on the light emitting element 20 and the wiring layer parts 12 due to the impact can be prevented when the light emitting device 100 is picked up by the nozzle 60. In particular, in the case where the light emitting device includes a light emitting element which emits ultraviolet light, the wiring layer parts are likely to deteriorate due to heat and light from the ultraviolet light emitting element. According to the present invention, the rate of deterioration can be reduced by preventing cracking of the protection film on the wiring layer parts.

After the light emitting device 100 is picked up by the nozzle 60, the light emitting device 100 is positioned at the desired position on the mount board 200. In the first embodiment, as shown in FIG. 5E, the light emitting device 100 is arranged above the wiring portions 201 of the mount board 200 (on the bonding material 70). At this time, since the nozzle 60 is brought in the protection film 40 on the base member 11 of the light emitting device 100 by sucking the light emitting device 100, cracking of the protection film 40 on the wiring layer parts 12 due to the impact can be prevented when the light emitting device 100 is placed onto the mount board 200.

After the light-emitting-device positioning step, the light emitting module 1000 can be produced by bonding the light emitting device 100 to the mount board 200 by any suitable method such as heating, or the like.

As discussed above, since the opening diameter of the of the nozzle and the size of the combination of the wiring layer parts of the wiring board of the light emitting device as viewed in plan view are adjusted so that the contact line of the nozzle is located on the protection film on the base member of the wiring board of the light emitting device, cracking of the protection film on the wiring layer parts can be prevented. Therefore, it is possible to suppress oxidation of the light emitting element 20 and deterioration of the wiring layer parts 12 caused by cracks of the protection film 40 on or in proximity to the wiring layer parts. Consequently, the produced light emitting module 1000 can be reliable.

Second Embodiment

Figure 7:
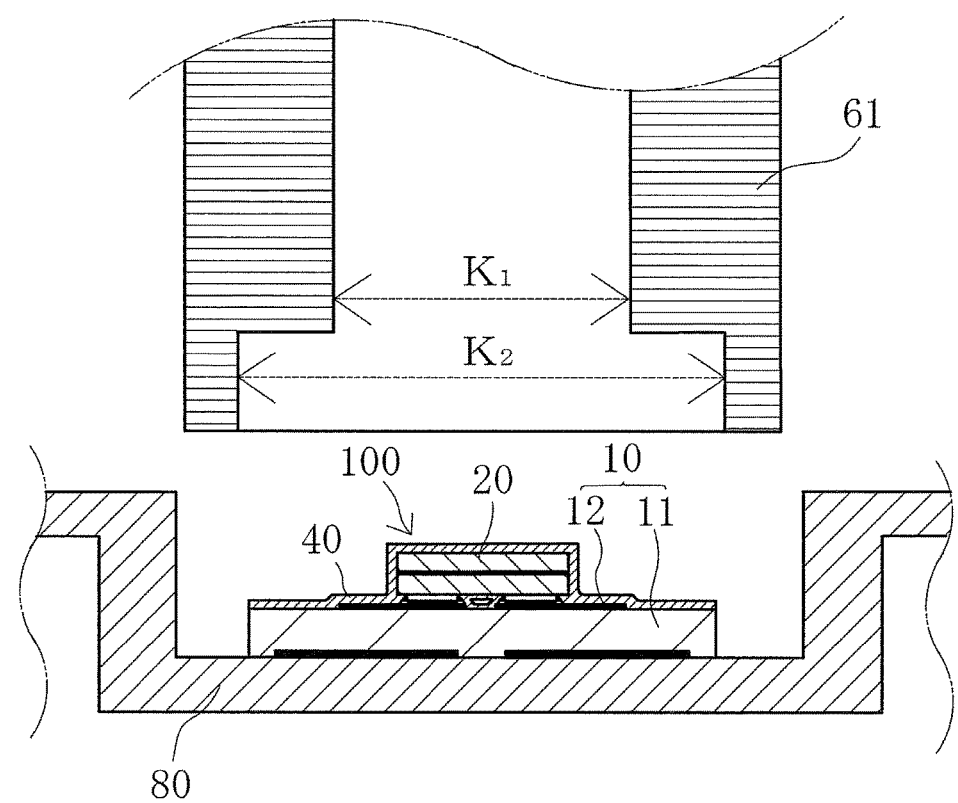
FIG. 7 is a schematic cross-sectional view showing a light-emitting-device positioning step according to a second embodiment using a nozzle having an opening shape different from FIG. 5D.

FIG. 7 is a schematic cross-sectional side view showing a light-emitting-device positioning step according to a second embodiment using a nozzle having an opening structure different from FIG. 5D. In the second embodiment, the nozzle is used which has a shape different from the nozzle used in the first embodiment. Here, the construction of a light emitting device to be prepared, the aforementioned steps except the nozzle preparation and light-emitting-device positioning steps, and the construction of a light emitting module produced by a method according to the second embodiment are similar to the first embodiment. Accordingly, their description is omitted.

Specifically, in the second embodiment, a nozzle 61 is prepared which has different opening diameters K at the end and the inside part of the nozzle 61. More specifically, the opening diameter $K_1$ of the inside part on the interior side of the prepared nozzle 61 is larger than the size of the combination of the wiring layer parts 12 of the light emitting device 100, and smaller than the wiring board 10 as viewed in plan view. Although the opening diameter $K_2$ of the end of the prepared nozzle 61 is not specifically limited as long as it is larger than the opening diameter $K_1$ of the inside part of the nozzle 61 as viewed in plan view, for example, the opening diameter $K_2$ can be larger than the wiring board 10 and not larger than the diameter of the recessed part of the embossed carrier tape in which the light emitting element is held at the light-emitting-element preparation step.

Subsequently, as shown in FIG. 7, in the light-emitting-device positioning step, when the light emitting device 100 is picked up by the nozzle 61 by sucking the light emitting device 100 by using the nozzle 61, the nozzle 61 contacts the protection film 40 on the base member 11 of the wiring board 10 so that the light emitting device 100 is mounted onto the mount board similarly to the first embodiment.

In the case where the nozzle 61 having the aforementioned opening is used, the light emitting device 100 can be more stably picked up and positioned as compared with the case where the nozzle used in the method of manufacturing the light emitting module according to the first embodiment is used.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting device comprising:
   a wiring board comprising
   a base member having upper surface, and
   positive and negative wiring layer parts arranged on or above the upper surface of said base member, each of said positive and negative wiring layer parts having a curved outer-side edge, the curvature of which is substantially constant;
   a light emitting element that is mounted on said wiring layer parts in a flip-chip manner; and
   a protection film that covers said base member, said wiring layer parts and said light emitting element, and is formed of an inorganic material for serving as the exterior surface of the light emitting device,
   wherein said wiring layer parts are arranged entirely inside an outer edge of said wiring board.

2. The light emitting device according to claim 1, wherein the plane shape of a combination of said wiring layer parts is substantially circular.

3. The light emitting device according to claim 1, wherein the distance between the center of said light emitting element and said outer-side edges of said wiring layer parts is substantially constant.

4. The light emitting device according to claim 1, wherein said protection film has a thickness within the range from 30 to 200 nm, and said light emitting element and said wiring board are covered by said protection film without gaps.

5. The light emitting device according to claim 1, wherein said protection film is formed of one selected from the group consisting of Al2O3, SiO2, AlN, and Si3N4.

6. The light emitting device according to claim 1, wherein said protection film is a multilayer film which is formed of inorganic materials.

7. The light emitting device according to claim 1, wherein said light emitting element emits light with a wavelength in the ultraviolet range.

8. A method of manufacturing a light emitting module comprising:

preparing a light emitting device that includes a wiring board having a base member and wiring layer parts arranged in the central part of said base member, a light emitting element bonded to said wiring layer parts, and a protection film formed of an inorganic material for covering said base member, said wiring layer parts and said light emitting element;

preparing a mount board that serves to hold said light emitting device;

preparing a nozzle that has an opening size greater than the size of a combination of said wiring layer part as viewed in plan view; and positioning said light emitting device on said mount board by picking up said light emitting device by suction by using said nozzle, while adjusting so that said nozzle is in contact with said protection film on said base member and said wiring layer parts are arranged entirely inside a contact circle of said nozzle.

9. The method of manufacturing a light emitting module according to claim 8, wherein the plane shape of a combination of said wiring layer parts of said wiring board is substantially circular, and the opening shape of said nozzle is substantially circular.

10. The method of manufacturing a light emitting module according to claim 8, wherein said nozzle is brought into contact with said protection film on said base member along a closed line, which encloses the opening shape of said nozzle and is spaced 0.05 to 0.25 mm away from the outline of the combination of said wiring layer parts, when said light emitting device is picked up by said nozzle.

* * * * *